US012640691B2

(12) United States Patent
Krishnamurthy

(10) Patent No.: US 12,640,691 B2
(45) Date of Patent: May 26, 2026

(54) COMPENSATION FOR REDUNDANT CURRENT LIMIT ARCHITECTURE FOR SAFETY DEVICES

(71) Applicant: TEXAS INSTRUMENTS INCORPORATED, Dallas, TX (US)

(72) Inventor: Ganapathi Shankar Krishnamurthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 514 days.

(21) Appl. No.: 18/344,967

(22) Filed: Jun. 30, 2023

(65) Prior Publication Data

US 2025/0007469 A1 Jan. 2, 2025

(51) Int. Cl.
*H03F 1/52* (2006.01)
*H03F 3/45* (2006.01)

(52) U.S. Cl.
CPC ......... *H03F 1/523* (2013.01); *H03F 3/45224* (2013.01); *H03F 3/45273* (2013.01); *H03F 2200/261* (2013.01)

(58) Field of Classification Search
CPC .. H03F 1/523; H03F 3/45224; H03F 3/45273; H03F 2200/261; H03F 3/45183; H01H 39/00
USPC ......................................................... 361/87
See application file for complete search history.

(56) References Cited

U.S. PATENT DOCUMENTS

| | | | | |
|---|---|---|---|---|
| 10,097,144 | B2 * | 10/2018 | Rudolph | H03F 1/565 |
| 2021/0013708 | A1 * | 1/2021 | Kambham | G01R 31/74 |
| 2023/0187922 | A1 * | 6/2023 | Randazzo | H02H 5/048 |
| | | | | 361/87 |

OTHER PUBLICATIONS

Power Supplies, Authors et al.: IBM, Ernst, LM, McCollum, WE, Original Publication Date: May 1, 1978 (Year: 1978).*
S. Pennisi, "A low-voltage design approach for class AB current-mode circuits," in IEEE Transactions on Circuits and Systems II: Analog and Digital Signal Processing, vol. 49, No. 4, pp. 273-279, Apr. 2002, doi: 10.1109/TCSII.2002.801463 (Year: 2002).*

* cited by examiner

*Primary Examiner* — Sreeya Sreevatsa
(74) *Attorney, Agent, or Firm* — Xianghui Huang; Frank D. Cimino

(57) ABSTRACT

In an example, a circuit includes a transistor and a first amplifier having an output coupled to a control terminal of the transistor. The circuit includes a second amplifier having a second amplifier output coupled to the control terminal of the transistor. The circuit includes a resistor-capacitor network. The circuit also includes a first switch coupled to the first amplifier output, the transistor, and the resistor-capacitor network. The circuit includes a second switch coupled to the second amplifier output, the transistor, and the resistor-capacitor network, where the first switch is configured to couple the first amplifier output to the resistor-capacitor network, and the second switch is configured to couple the second amplifier output to the resistor-capacitor network.

20 Claims, 5 Drawing Sheets

COMPENSATION FOR REDUNDANT CURRENT LIMIT ARCHITECTURE FOR SAFETY DEVICES

BACKGROUND

A pyrotechnical safety switch (also referred to herein as a pyro fuse) enables a safe and instant shutdown of a high voltage electrical current. A pyro fuse, which for example can be coupled to a high voltage positive battery terminal, explodes and irreversibly disconnects an electrical connection to the battery terminal to avoid a short circuit or a fire. In some examples, pyro fuses are triggered by an airbag control unit and/or a battery management system in an electric or hybrid vehicle. In the pyro fuse, current is pumped through a resistive element which creates a small explosion. In an example, the explosion disconnects a bus bar that couples the battery to a high voltage source in the automobile. Thus, in case of an accident, the battery is disconnected.

SUMMARY

In at least one example of the description, a circuit includes a transistor and a first amplifier having an output coupled to a control terminal of the transistor. The circuit includes a second amplifier having a second amplifier output coupled to the control terminal of the transistor. The circuit includes a resistor-capacitor network. The circuit also includes a first switch coupled to the first amplifier output, the transistor, and the resistor-capacitor network. The circuit includes a second switch coupled to the second amplifier output, the transistor, and the resistor-capacitor network, where the first switch is configured to couple the first amplifier output to the resistor-capacitor network, and the second switch is configured to couple the second amplifier output to the resistor-capacitor network.

In at least one example of the description, a circuit includes a transistor and a pyro fuse. The circuit also includes a first current source and a second current source, a resistor, and a resistor-capacitor network. The circuit includes a first amplifier having a first amplifier output coupled to a control terminal of the transistor, a first amplifier input coupled to the pyro fuse, and a second amplifier input coupled to the first current source. The circuit also includes a second amplifier having a second amplifier output coupled to the control terminal of the transistor, a third amplifier input coupled to the second current source, and a fourth amplifier input coupled to the resistor. The circuit includes a first switch coupled to the first amplifier output, the transistor, and the resistor-capacitor network. The circuit also includes a second switch coupled to the second amplifier output, the transistor, and the resistor-capacitor network, where the first switch is configured to couple the first amplifier output to the resistor-capacitor network, and the second switch is configured to couple the second amplifier output to the resistor-capacitor network.

In at least one example of the description, a circuit includes a first switch and a second switch. The circuit includes a transistor and a pyro fuse. The circuit also includes a first amplifier having a first amplifier output coupled to the first switch and to a control terminal of the transistor configured to control the pyro fuse. The circuit includes a second amplifier having a second amplifier output coupled to the second switch and to the control terminal of the transistor configured to control the pyro fuse. The circuit also includes a resistor-capacitor network configured to compensate the first amplifier and the second amplifier, where the resistor-capacitor network is coupled to the first amplifier via the first switch and coupled to the second amplifier via the second switch.

DETAILED DESCRIPTION

In a pyro fuse, current is provided through a resistive element, which creates a small explosion, which "blows the fuse", to disconnect circuitry from a voltage or current source, for example. The pyro fuse is a safety device, and therefore redundancy is included. In an example pyro fuse, two amperes is sent through the fuse in about two milliseconds to blow the fuse. One example pyro fuse architecture includes redundant current limit circuitry, referred to herein as a first (primary) amplifier architecture (having a first or primary amplifier) and a second (secondary) amplifier architecture (having a second or secondary amplifier). If the primary amplifier architecture fails (such as with a short circuit), the secondary amplifier architecture becomes operational to provide the current limit redundancy so the pyro fuse remains operational. In an example, a resistor and capacitor (RC) circuit (also referred to herein as an RC network) provides frequency response compensation for each amplifier. One example RC network uses high voltage capacitors. Thus, having separate RC networks for the primary and secondary amplifiers would consume a large amount of die area.

In examples herein, a circuit architecture is described that uses one RC network for compensating both the primary amplifier and the secondary amplifier. At any given time, only one of the amplifiers is active. Switches are included that couple the active amplifier to the RC network. Therefore, the RC network is shared between the two amplifiers, and large area savings may be realized. Because the capacitors may take up a large amount of area, in some examples the layout area may be reduced by 20% or more by sharing the RC network.

Figure 1:
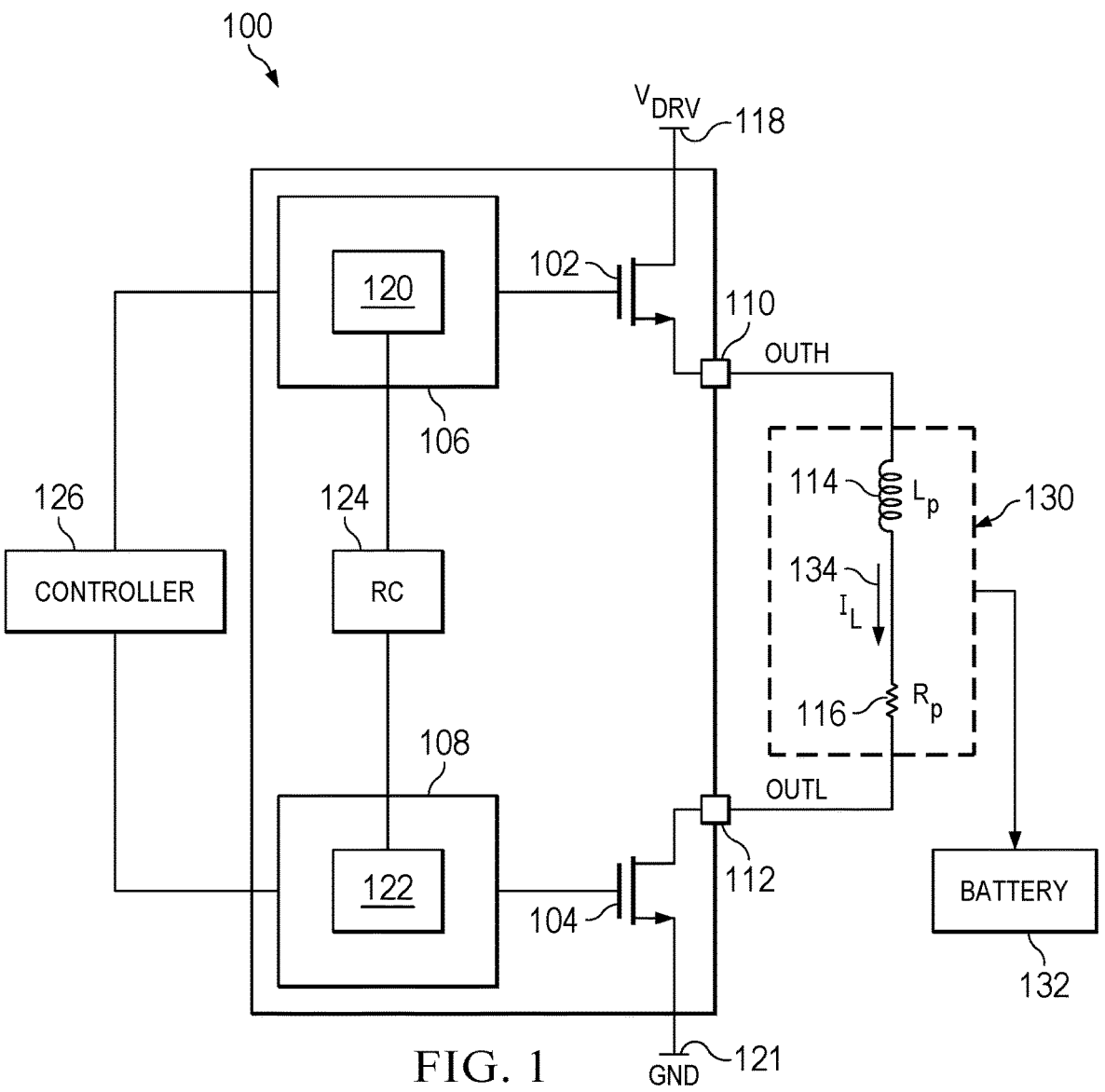
FIG. 1 illustrates an example system that includes a pyro fuse.

FIG. 1 illustrates a system 100. System 100 may be included in a battery monitoring system in one example. System 100 includes a high side transistor 102, a low side transistor 104, a high side driver (circuit) 106 including an amplifier 120, and a low side driver (circuit) 108 including an amplifier 122. System 100 also includes a high output node 110 (OUT$_H$) and a low output node 112 (OUT$_L$). System 100 includes a first voltage terminal 118 at which a first voltage $V_{DRV}$ is provided. $V_{DRV}$ may be 5 V in one example. System 100 includes a second voltage terminal 121 at which a second voltage, e.g., electrical ground (GND) in one example, is provided. System 100 further includes an RC network 124, a controller 126, a pyro fuse 130, and a battery 132. In an example, battery 132 is used to operate an electric vehicle in which system 100 is incorporated. The pyro fuse 130 is represented as an inductive element 114 having an inductance of $L_P$ and a resistive element 116 having a resistance of $R_P$. A load current $I_L$ 134 flows through pyro fuse 130. High side transistor 102 and low side transistor 104 are field effect transistors (FETs) in one example. As shown, high side transistor 102 and low side transistor 104 are n-channel FETs (NFETS). In other examples, one or both of the high side transistor 102 and low side transistor 104 is another type of FET or another type of transistor. High side transistor 102 connects between a load (such as pyro fuse 130) and a positive voltage (e.g., $V_{DRV}$). Low side transistor 104 connects between a load (such as pyro fuse 130) and ground (GND) in this example. High side driver 106 provides circuitry to drive high side transistor 102, and low side driver 108 provides circuitry to drive low side transistor 104.

High side driver 106 has a terminal (e.g., an output of amplifier 120) coupled to a gate of high side transistor 102. Low side driver 108 has a terminal (e.g., a gate of a sense transistor) coupled to a gate of low side transistor 104. The pyro fuse 130 is coupled between nodes 110 and 112, in which a first terminal of the pyro fuse 130 is coupled to high output node 110, and a second terminal of the pyro fuse 130 is coupled to low output node 112.

In one example, amplifier 122 is a primary amplifier, and amplifier 120 is a secondary amplifier. Each amplifier 120 and 122 has a respective terminal coupled to the RC network 124. As described above, because amplifier 120 and amplifier 122 share an RC network 124, area usage for the system 100 may be reduced.

As illustrated, a drain of high side transistor 102 is coupled to voltage terminal 118, and a source of high side transistor 102 is coupled to high output node 110. A gate of high side transistor 102 is coupled to high side driver 106. A drain of transistor 104 is coupled to low output node 112, and a source of low side transistor 104 is coupled to voltage terminal 121. A gate of low side transistor 104 is coupled to low side driver 108. A first terminal of RC network 124 is coupled to high side driver 106, and a second terminal of RC network 124 is coupled to low side driver 108.

System 100 provides redundant architecture for managing a pyro fuse 130. Pyro fuse 130 can disconnect an electrical connection to battery 132 to, for example, avoid a short circuit or a fire. Pyro fuse 130 includes an electrically activated pyrotechnic charge. The charge is activated by driving a sufficient current $I_L$ 134 through pyro fuse 130. For example, controller 126 determines if the pyro fuse 130 should be activated responsive to a specific condition, such as detecting a high current in another circuit or detecting a crash of the automobile. Controller 126 activates the pyro fuse 130 by providing signals to high side driver 106 and/or low side driver 108 to increase the current $I_L$ 134 through the pyro fuse 130 and activate the pyrotechnic charge. Activation of the pyrotechnic charge in the pyro fuse 130 drives a piston (not shown in FIG. 1) through a conductor, where the piston includes a nonconductive severing member, such as a plastic or ceramic blade. The conductor is a bus bar coupled to battery 132, in one example. Driving the piston through the conductor separates the conductor and creates an open circuit in the conductor, where the open circuit separates the battery 132 from the rest of the circuitry in the system. Separating the battery 132 from the bus bar provides a safe and instant shutdown of a high voltage electrical current.

Some elements of system 100 may be incorporated into a battery management system, in one example. Elements in system 100 may be included on one or more chips, dies, or integrated circuits. Elements in system 100 may be combined on different chips on a printed circuit board (PCB) or within a package, such as within a battery management system module, an airbag control unit module, etc. Elements in system 100 may be included in a module or package that is separate from the battery management system module, the airbag control unit module, etc.

In operation, high side transistor 102 and low side transistor 104 provide current through the pyro fuse 130 (e.g., $L_P$ 114 and $R_P$ 116) to manage the activation of the pyro fuse 130. The primary amplifier (such as amplifier 122) and low side transistor 104 are active in normal operation. If a short circuit or other failure occurs with amplifier 122 or low side transistor 104, the secondary amplifier (such as amplifier 120) and high side transistor 102 take over and provide the current through the pyro fuse 130. System 100 therefore provides redundancy, so one of the amplifiers is active and capable of activating the pyro fuse 130 in the case when the other amplifier is inactive. If a fault condition, high current, or automobile crash is detected, controller 126 provides control signals to driver 108 or driver 106 (whichever is active) to increase the current $I_L$ 134 responsive to the detection. The increased current $I_L$ 134 activates the pyro fuse 130, which breaks the physical connection between the battery and other circuitry as described above. The current $I_L$ 134 may be increased by increasing a reference current $I_{REF}$ (not shown in FIG. 1) as described with respect to FIG. 2 below. If the primary amplifier (such as amplifier 122) is not operational, the high side transistor 102 and the circuitry coupled to it (such as secondary amplifier 120) is configured to regulate and activate the pyro fuse. Therefore, if the primary amplifier 122 stops working (such as due to a short circuit), the secondary amplifier 120 provides redundancy. A short circuit that disables primary amplifier 122 may occur due to damage to system 100, such as damage to the circuit in the event of an automobile crash. Short circuits may also be caused by aging devices, metal fragments, electrostatic discharge damage, or device breakdown.

Figure 2:
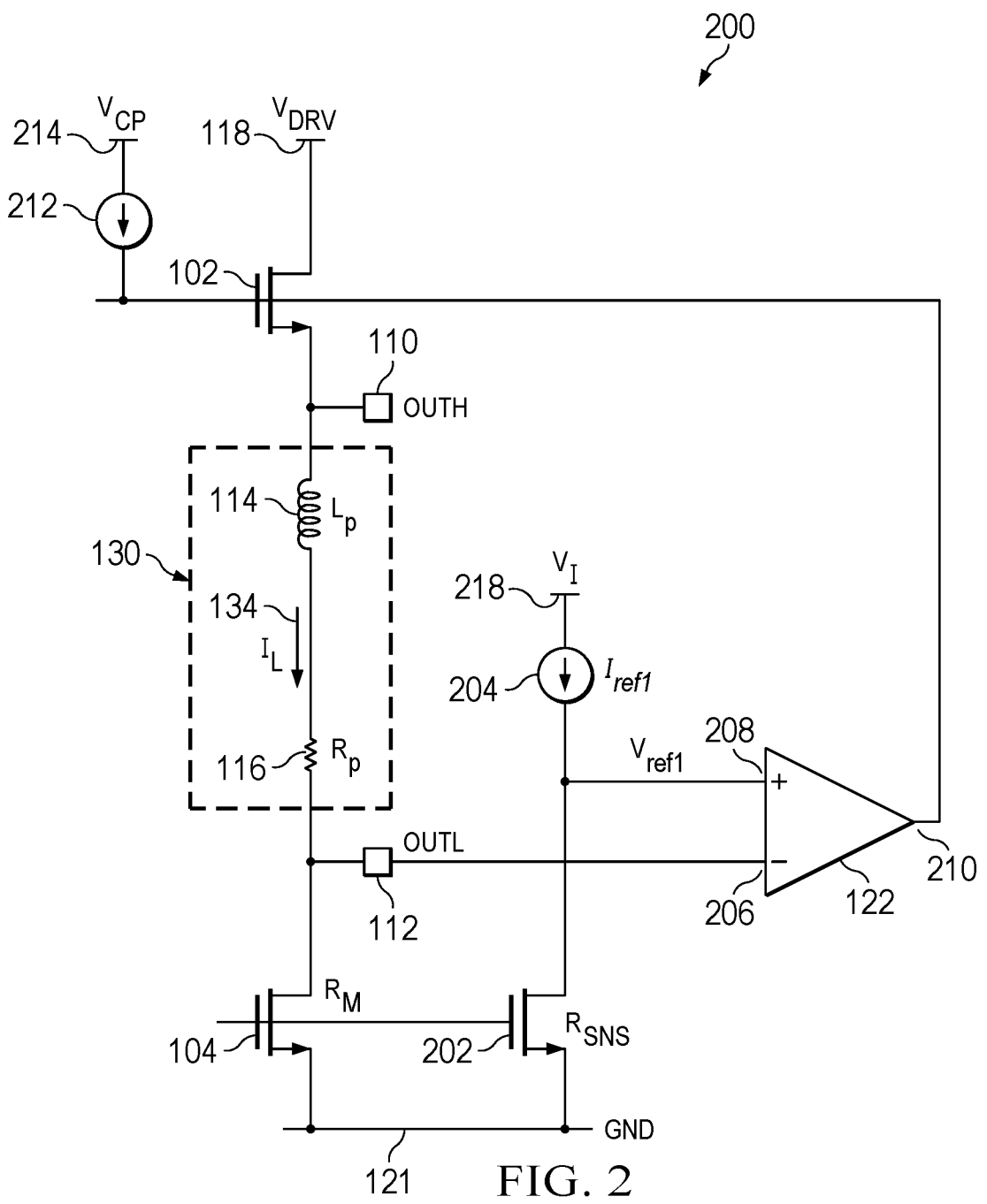
FIG. 2 illustrates an example circuit including a current limit architecture for a primary amplifier coupled to a pyro fuse.
Figure 3:
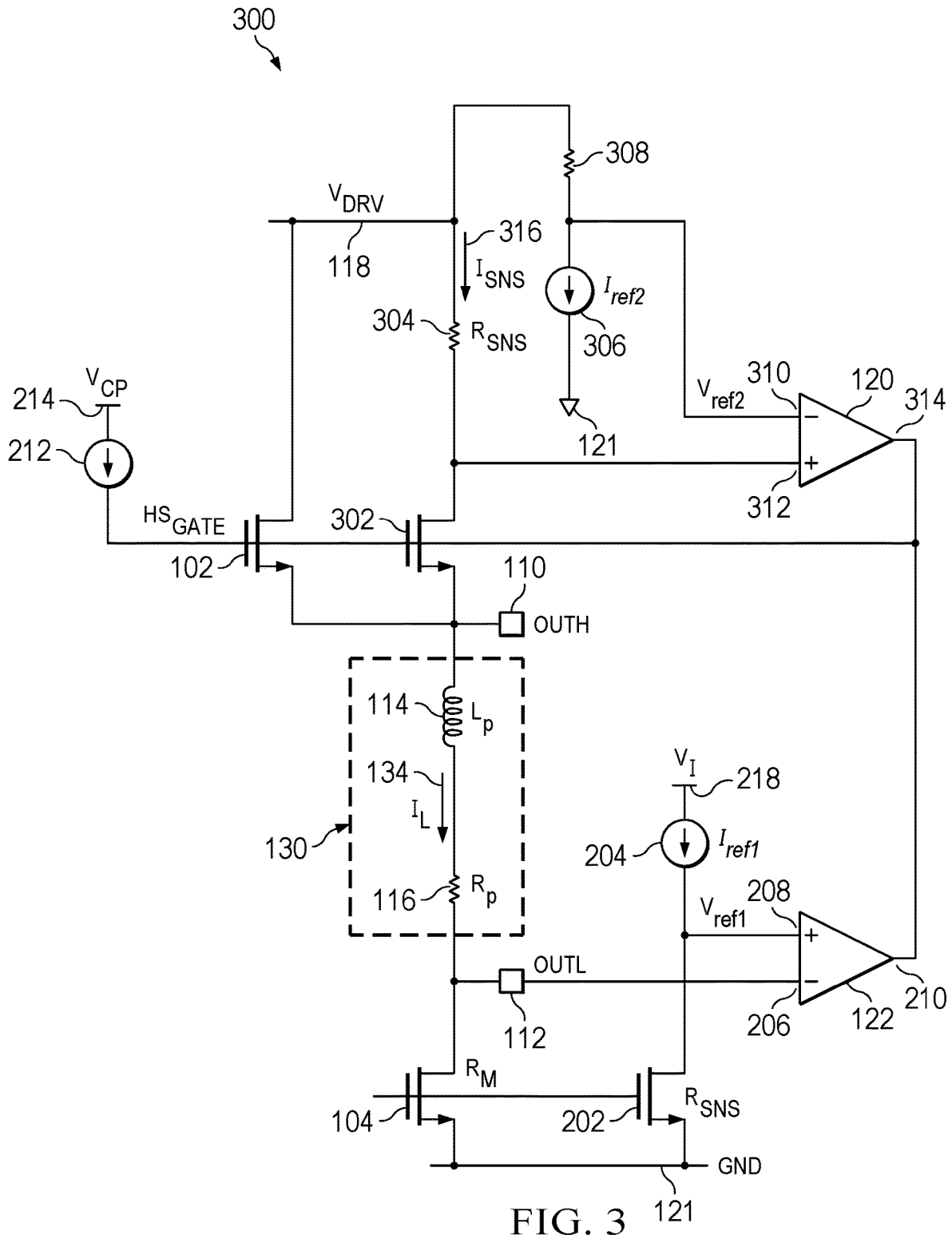
FIG. 3 illustrates an example circuit including a current limit architecture with redundancy, for a pyro fuse.
Figure 4:
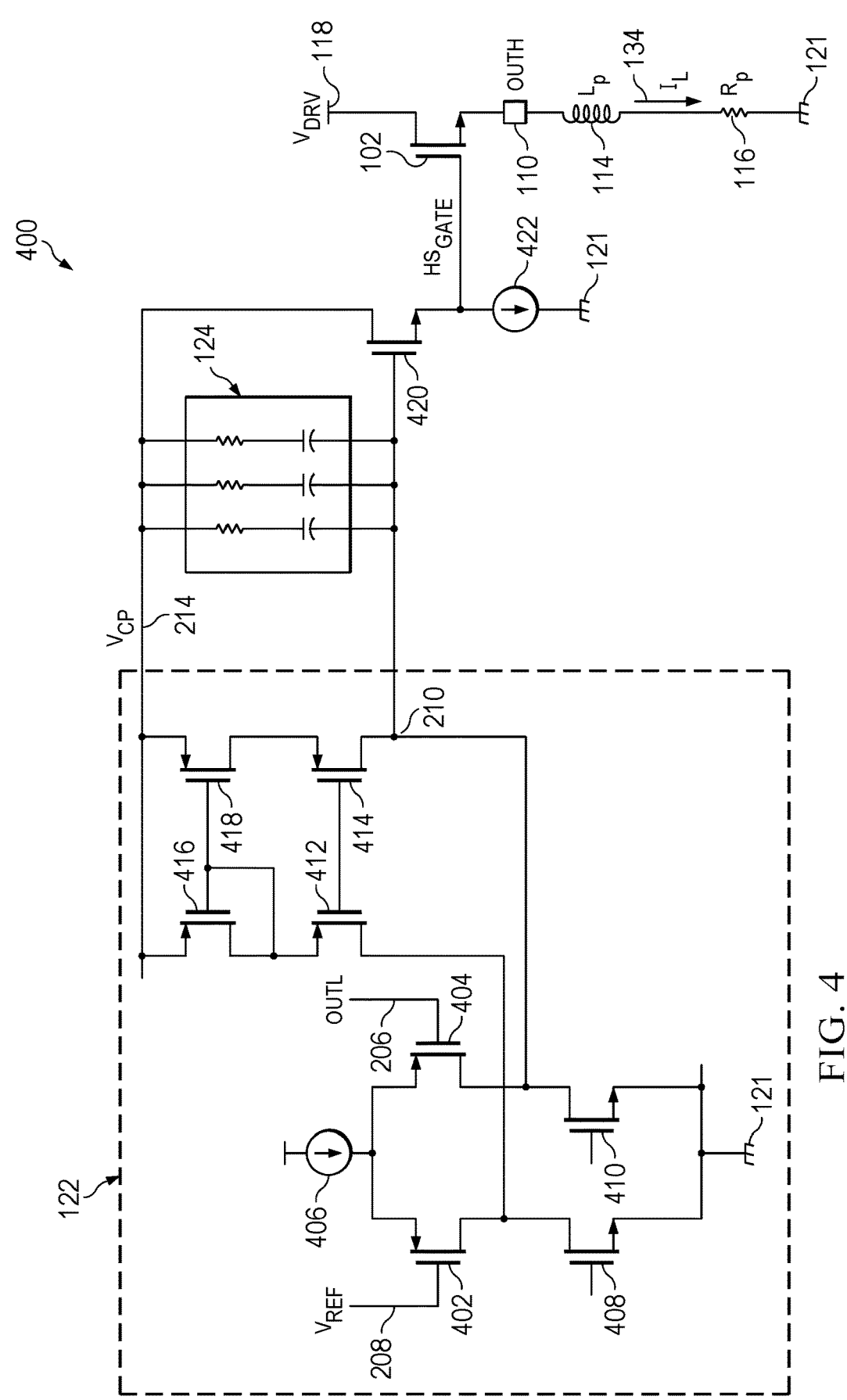
FIG. 4 illustrates an example circuit including an amplifier and compensation circuit for a current limit architecture for a pyro fuse.
Figure 5:
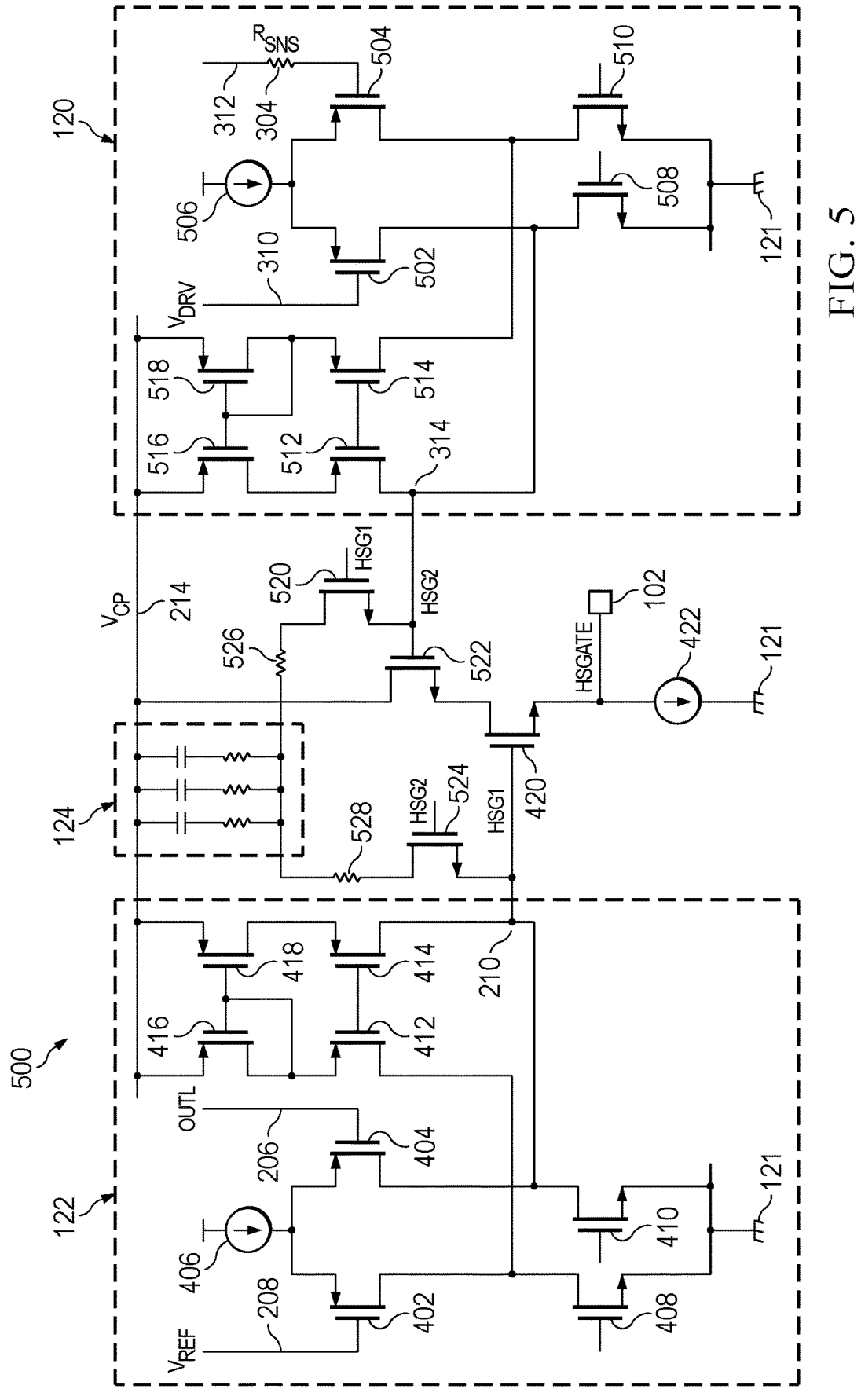
FIG. 5 illustrates an example circuit including two amplifiers sharing a compensation circuit, for a current limit architecture for a pyro fuse.

In examples herein, a circuit architecture is described that uses one RC network for compensating both the primary amplifier 122 and the secondary amplifier 120. As described above, at any given time, only one of the amplifiers is active. Switches are included that couple the active amplifier to the RC network. Therefore, the RC network is shared between the two amplifiers, and large area savings may be realized. Circuitry for the operation of amplifiers 120, 122, and RC network 124 is provided below. For instance, FIGS. 4 and 5 show example circuitry for amplifiers 120, 122, and RC network 124. FIG. 2 illustrates an example circuit 200 including a current limit architecture for a primary amplifier e.g., amplifier 122 coupled to a pyro fuse, e.g., pyro fuse 130. Some components in circuit 200 are described above with respect to system 100, and like numerals denote like components. The current limit architecture with redundancy and including a primary and a secondary amplifier, e.g., amplifiers 122 and 120 respectively, is shown in FIG. 3.

In FIG. 2, circuit 200 includes high side transistor 102, low side transistor 104, high output node 110, low output node 112, pyro fuse 130, first voltage terminal 118, second voltage terminal 121, and amplifier 122 (e.g., the primary amplifier). Load current $I_L$ 134 is also shown in FIG. 2. Circuit 200 also includes a sense transistor 202, a current source 204, a current source 212, a voltage terminal 214, and a voltage terminal 218. Amplifier 122 has a first (inverting) input 206, a second (noninverting) input 208, and an output 210. In some examples, sense transistor 202, current source 204, and voltage terminal 218 are components of low side driver 108 in FIG. 1. Other components (not shown in FIG. 2) of low side driver 108 may be coupled to low side transistor 104, such as components that connect the gate of low side transistor 104 to controller 126. Current source 212 and voltage terminal 214 are components of high side driver 106 in FIG. 1 in one example. Other components (not shown in FIG. 2) of high side driver 106 may be coupled to high side transistor 102, such as components that connect the gate of high side transistor 102 to controller 126.

Sense transistor 202 in this case is an n-channel FET with a gate coupled to the gate of low side transistor 104. A drain of sense transistor 202 is coupled to current source 204, which provides a current $I_{ref1}$. The drain of sense transistor 202 is also coupled to second input 208 of amplifier 122. A source of sense transistor 202 is coupled to voltage terminal 121. Current source 204 has a first terminal coupled to a drain of sense transistor 202 and a second terminal coupled to voltage terminal 218. A voltage $V_1$ is provided at voltage terminal 218, which may be 5 V in one example. First input 206 of amplifier 122 is coupled to low output node 112, which is coupled to the drain of low side transistor 104 and to the second terminal of the pyro fuse 130. Second input 208 is coupled to the second terminal of current source 204 and to the drain of sense transistor 202. Output 210 is coupled to the gate of high side transistor 102. The gate of high side transistor 102 is also coupled to a first terminal of current source 212. Current source 212 has a second terminal coupled to a voltage terminal 214, at which a voltage $V_{CP}$ is provided. Current source 212 provides a bias current for high side transistor 102. In one example, $V_{CP}$ is $V_{DRV}$ plus 5 V (e.g., $V_{CP}$ may be 10 V). The drain of high side transistor 102 is coupled to voltage terminal 118, and the source of high side transistor 102 is coupled to high output node 110 and a first terminal of pyro fuse 130. The load current through the pyro fuse is shown as $I_L$ 134. Drivers 106, 108, and controller 126 are not shown in FIG. 2.

In operation, when low side transistor 104 is operational and used to manage pyro fuse 130, current flows through low side transistor 104. Sense transistor 202 is coupled to low side transistor 104. The current that flows through sense transistor 202 is proportionate to the current flowing through low side transistor 104, because the gates and sources of each transistor are coupled together. Current source 204 provides bias current to sense transistor 202. The current $I_{ref1}$ provided by current source 204 creates a voltage $V_{ref1}$ at second input 208 of amplifier 122. Output 210 of amplifier 122 regulates the gate of high side transistor 102 so high side transistor 102 produces enough current $I_L$ 134 to hold the voltage at low output node 112 at $V_{ref1}$. Therefore, the voltage at low output node 112 is regulated at $V_{ref1}$. The voltage at low output node 112 is equal to the value of $I_L$ 134 times a resistance $R_M$ of low side transistor 104. This voltage is shown in Equation (1):

$$I_{ref1}R_{sns} = I_L R_m \quad (1)$$

On the left side of Equation (1), $I_{ref1}$ is the current produced by current source 204 multiplied by the resistance $R_{sns}$ of sense transistor 202. On the right side of Equation (1), $I_L$ 134 is the load current through the pyro fuse multiplied by the resistance $R_M$ of low side transistor 104. Amplifier 122 equalizes the voltages at first input 206 and second input 208, as shown in Equation (1). Where low side transistor 104 and sense transistor 202 are manufactured to be similar sizes, $R_M$ and $R_{sns}$ may be similar across temperature and process variations. Therefore, by setting the value of $I_{ref1}$, $I_L$ 134 may be regulated at any desired current, such as 1 A. Accordingly, $I_L$ 134 is programmable or adjustable by selecting the value of $I_{ref1}$. If a situation is detected by controller 126 that the pyro fuse 130 is to be blown, controller 126 increases the value of $I_{ref1}$, and $I_L$ 134 increases to a value sufficient to activate the pyrotechnic charge and blow the pyro fuse 130.

In the architecture of circuit 200, the circuit may not operate properly in the event that the low output node 112 is shorted to ground 121, for example. If that occurs, the regulation loop shown in circuit 200 will not work. The voltage at low output node 112 would remain at ground 121 (e.g., zero volts). In that scenario, the pyro fuse 130 will not work. Redundancy is therefore included to maintain an operational pyro fuse 130 in the event of this type of short circuit.

FIG. 3 shows one example of a circuit that provides the above-mentioned redundancy. FIG. 3 illustrates an example circuit 300 including a current limit architecture with redundancy, for a pyro fuse. Some components in circuit 300 are described above with respect to system 100 and circuit 200, and like numerals denote like components. Circuit 300 includes the components described above with respect to FIG. 2. Circuit 300 also includes amplifier 120, which is coupled to high side transistor 102.

Circuit 300 further includes sense transistor 302, a resistor $R_{sns}$ 304, a current source 306, and a resistor 308. Sense transistor 302, a resistor $R_{sns}$ 304, current source 306, and resistor 308 may be components of high side driver 106 in one example. Amplifier 120 has a first (inverting) input 310, a second (noninverting) input 312, and an output 314. Sense transistor 302, which is shown as an NFET, has a gate coupled to the gate of high side transistor 102. Sense transistor 302 has a source coupled to high output node 110, to the source of high side transistor 102, and to the first terminal of pyro fuse 130. Sense transistor 302 has a drain coupled to a first terminal of resistor $R_{sns}$ 304. A second terminal of $R_{sns}$ 304 is coupled to voltage terminal and a first terminal of resistor 308. A second terminal of resistor 308 is coupled to a first terminal of current source 306. A second terminal of current source 306 is coupled to voltage terminal 121.

Current source 306 and resistor 308 produce a voltage $V_{ref2}$ that is provided to a first (inverting) input 310 of amplifier 120. A second (noninverting) input 312 of amplifier 120 is coupled to $R_{sns}$ 304 and the drain of sense transistor 302. Amplifier 120 has an output 314 coupled to the gate of sense transistor 302 and to the gate of high side transistor 102.

Circuit 300 provides a redundant current limit on high side transistor 102. If low output node 112 is shorted, high side transistor 102 is used to manage the current $I_L$ 134 rather than low side transistor 104. Conversely, if high output node 110 is shorted to a voltage such as $V_{DRV}$, amplifier 120 will not work. However, in that case, amplifier 122 is operational and low side transistor 104 is used to manage the current $I_L$ 134 through the pyro fuse 130.

In one example operation, current source 306 produces a current reference $I_{ref2}$. Current source 306 and resistor 308 generate a voltage $V_{ref2}$ for amplifier 120. The voltage $V_{ref2}$ at first input 310 sets the current limit for amplifier 120 (at 1.2 A, for example), similar to the voltage $V_{ref2}$ at second input 208 of amplifier 122 that sets the current limit of 1 A for amplifier 122 as described above. $V_{ref2}$ at first input 310 may be a different value than $V_{ref1}$ at second input 208.

A current $I_{SNS}$ 316 passes through $R_{sns}$ 304 to provide a voltage to second input 312 of amplifier 120. Sense transistor 302 and $R_{sns}$ 304 produce the current $I_{SNS}$ 316 that is proportional to the current $I_L$ 134. Therefore, the voltage at second input 312 is also proportional to the current $I_L$ 134. Providing this voltage that is proportional to current $I_L$ 134 to second input 312 of amplifier 120 provides a similar function as $I_L$ 134 being provided to first input 206 of amplifier 122. The sensing operation for amplifier 120 on the high side is different than the sensing operation for amplifier 122 on the low side, but both amplifiers 120 and 122 sense the value of $I_L$ 134 (or a proportional value) at one input to the amplifier and compare it to a reference (e.g., $V_{ref1}$ or $V_{ref2}$) at the other input to the amplifier. The current limit for amplifier 120 may be regulated at any desired current by selecting appropriate values for the current $I_{ref2}$ provided by current source 306 and the size of resistor 308, which produces a desired $V_{ref2}$ at first input 310 of amplifier 120. Controller 126 (not shown in FIG. 3) may provide a signal to blow the pyro fuse 310 by increasing the current provided by high side transistor 102, which increases $I_L$ 134, if amplifier 120 and high side transistor 102 are the active components controlling $I_L$ 134 (e.g., during the times that amplifier 122 and/or low side transistor 104 are disabled due to a short circuit or for another reason).

To stabilize the architecture shown in circuit 300, additional circuitry may be coupled to amplifiers 120 and 122 (not shown in FIG. 3). The additional circuitry may provide two poles for the circuit. The two-pole architecture uses an RC network to stabilize the circuit. In the example of a pyro fuse, the voltage at the gate of high side transistor 102 may range from 0 to 40 V. Therefore, high voltage capacitors are useful for stability. The high voltage capacitors may take a lot of area. In examples herein, the RC network is shared between amplifier 120 and 122 to reduce area consumption.

FIG. 4 illustrates an example circuit 400 including an amplifier and compensation circuit for a current limit architecture of a pyro fuse circuit. Some components in circuit 400 are described above with respect to system 100 and circuits 200 and 300, and like numerals denote like components. In this example, amplifier 122 is coupled to RC network 124 and the gate of high side transistor 102. RC network 124 provides compensation to stabilize amplifier 122. Amplifier 122 includes first input 206 coupled to low output node 112 and second input 208 coupled to current source 204 (not shown) that receives the voltage $V_{ref}$. Output 210 is coupled to RC network 124. Amplifier 122 may have other configurations in other examples. In this example, amplifier 122 includes input transistors 402 and 404. Amplifier 122 also includes current source 406 and transistors 408, 410, 412, 414, 416, and 418. Circuit 400 includes transistor 420 and current source 422.

Input transistors 402 and 404 are coupled to second input 208 and first input 206, respectively. Transistor 402 includes a gate coupled to second input 208 of amplifier 122, a source coupled to current source 406 and to the source of transistor 404, and a drain coupled to the drain of transistor 408 and the drain of transistor 412. Transistor 404 includes a gate coupled to first input 206 of amplifier 122, a source coupled to current source 406 and to the source of transistor 402, and a drain coupled to the drain of transistor 410 and the drain of transistor 414.

Transistor 408 has a gate that may be coupled to additional bias circuitry (not shown in FIG. 4), a drain coupled to the drain of transistor 402, and a source coupled to voltage terminal 121, which may be ground. Transistor 410 has a gate that may be coupled to additional bias circuitry (not shown in FIG. 4), a drain coupled to the drain of transistor 404, and a source coupled to voltage terminal 121. Controller 126 may control the gates of transistors 408 and 410 in one example. Transistor 412 has a gate coupled to the gate of transistor 414, a drain coupled to the drain of transistor 402, and a source coupled to the drain of transistor 416. Transistor 414 has a gate coupled to the gate of transistor 412, a drain coupled to the drain of transistor 404, and a source coupled to the drain of transistor 418.

Transistor 416 has a gate coupled to its drain and to the gate of transistor 418. Transistor 416 has a drain also coupled to the source of transistor 412, and a source coupled to voltage terminal 214. Transistor 418 has a gate coupled to the gate of transistor 416, a drain coupled to the source of transistor 414, and a source coupled to voltage terminal 214. Transistor 420 has a gate coupled to the drain of transistor 414 and to a first terminal of RC network 124. Transistor 420 has a drain coupled to voltage terminal 214 and to a second terminal of RC network 124. Transistor 420 has a source coupled to the gate of high side transistor 102 (e.g., $HS_{GATE}$) and to a first terminal of current source 422. Current source 422 has a second terminal coupled to voltage terminal 121.

Input transistors 402 and 404 are FETs in one example. Current source 406, transistor 408, and transistor 410 provide bias for input transistors 402 and 404. Transistors 416 and 418 are configured as a current mirror in this example.

In operation, input signals are received at first input 206 and second input 208 of amplifier 122, and an output signal is provided at output 210. RC network 124 provides compensation for amplifier 122. The output signal at output 210 is coupled to $HS_{GATE}$, and the output signal regulates $I_L$ 134 flowing through the pyro fuse 130 via high side transistor 102. RC network 124 may include any number of resistors and capacitors, arranged in any configuration, to provide appropriate compensation for amplifier 122. The capacitors may be high voltage capacitors that consume a relatively large amount of circuit area in one example.

As described herein, RC network 124 is shared between a primary amplifier 122 and a secondary amplifier 120. Circuit 400 shows one amplifier 122, which may be a primary amplifier, that is compensated via RC network 124. FIG. 5, described below, provides an example architecture for two amplifiers that share an RC network 124. FIG. 5 also includes switches that allow the primary amplifier 120 and the secondary amplifier 122 to be coupled to or uncoupled from RC network 124.

FIG. 5 illustrates an example circuit including two amplifiers sharing a compensation circuit, for a current limit architecture of a pyro fuse circuit. The two amplifiers in circuit 500 share an RC network 124 as described herein, which reduces the total area of the circuit. Some components in circuit 500 are described above with respect to system 100 and circuits 200, 300, and 400, and like numerals denote like components. Circuit 500 includes the components described above with respect to FIG. 4. Circuit 500 also includes amplifier 120 and a network of switches to couple amplifiers 120 and 122 to RC network 124.

Circuit 500 includes the internal circuitry of amplifier 120. The internal circuitry and operation of amplifier 120 is similar to the internal circuitry and operation of amplifier 122, described above with respect to FIG. 4. Amplifier 120 includes first input 310 coupled to first voltage terminal 118 and second input 312 coupled to $R_{sns}$ 304. Output 314 is coupled to RC network 124 through various switches that are described below. Amplifier 120 may have other configurations in other examples. In this example, amplifier 120 includes input transistors 502 and 504. Amplifier 122 also includes current source 506 and transistors 508, 510, 512, 514, 516, and 518. Circuit 500 includes transistors 520, 522, and 524. Circuit 500 includes resistors 526 and 528.

Input transistors 502 and 504 are coupled to first input 310 and second input 312 of amplifier 120, respectively. Transistor 502 includes a gate coupled to first input 310 of amplifier 120, a source coupled to current source 506 and to the source of transistor 504, and a drain coupled to the drain of transistor 405 and the drain of transistor 512. Transistor 504 includes a gate coupled to second input 312 of amplifier 120, a source coupled to current source 506 and to the source of transistor 502, and a drain coupled to the drain of transistor 510 and the drain of transistor 514.

Transistor 508 has a gate that may be coupled to additional bias circuitry (not shown in FIG. 5), a drain coupled to the drain of transistor 502, and a source coupled to voltage terminal 121, which may be ground. Transistor 510 has a gate that may be coupled to additional bias circuitry (not shown in FIG. 5), a drain coupled to the drain of transistor 504, and a source coupled to voltage terminal 121. Controller 126 may control the gates of transistors 508 and 510 in one example. Transistor 512 has a gate coupled to the gate of transistor 514, a drain coupled to the drain of transistor 502, and a source coupled to the drain of transistor 516. Transistor 514 has a gate coupled to the gate of transistor 512, a drain coupled to the drain of transistor 504, and a source coupled to the drain of transistor 518.

Transistor 516 has a gate coupled to the gate of transistor 518. Transistor 516 has a drain coupled to the source of transistor 512, and a source coupled to voltage terminal 214. Transistor 518 has a gate coupled to its drain and to the gate of transistor 516, a drain coupled to the source of transistor 514, and a source coupled to voltage terminal 214.

Input transistors 502 and 504 are FETs in one example. Current source 506, transistor 508, and transistor 510 provide bias for input transistors 502 and 504. Transistors 516 and 518 are configured as a current mirror in this example.

Transistor 520 has a gate coupled to output 210 (labeled as HSG1), a drain coupled to a first terminal of resistor 526, and a source coupled to the gate of transistor 522 (labeled as HSG2). Resistor 526 has a second terminal coupled to RC network 124. Transistor 522 has a gate coupled to the source of transistor 520 and to output 314 of amplifier 120. Transistor 522 has a drain coupled to voltage terminal 214 and a source coupled to the drain of transistor 420.

Transistor 524 has a gate coupled to the gate of transistor 522 (labeled as HSG2). Transistor 524 has a drain coupled to a first terminal of resistor 528 and a source coupled to the gate of transistor 420 and output 210 of amplifier 122. Resistor 528 has a second terminal coupled to RC network 124.

Transistors 520, 522, and 524 operate as switches that couple either amplifier 120 or amplifier 122 to the gate of high side transistor 102 via $HS_{GATE}$. In this example, output 314 of amplifier 120 is coupled to a source of transistor 520 and a gate of transistor 522. Output 210 of amplifier 122 is coupled to a source of transistor 524 and a gate of transistor 420. Output 210 is also coupled to the gate of transistor 520, and this connection is labeled HSG1 in FIG. 5. Output 314 is also coupled to the gate of transistor 524, and this connection is labeled HSG2. The voltage values on HSG1 and HSG2, provided by the outputs of amplifiers 122 and 120, respectively, operate transistors 520, 522, and 524 as described herein. These transistors couple the active amplifier (either amplifier 120 or 122) to RC network 124 as described herein.

In operation, a signal at $HS_{GATE}$ drives the high side transistors 102/302, which in turn controls the pyro fuse 130 as described above with respect to FIGS. 2 and 3. In a first example, the primary amplifier is amplifier 122 and is working at this time. The reference voltages $V_{ref}$ at first input 208 and first input 310 are set in such a way that amplifier 120 saturates if amplifier 122 is on. If amplifier 122 is on, the voltage at HSG1 (coupled to output 210) is less than the voltage at HSG2. The voltages at HSG1 and HSG2 turn on transistor 524. If transistor 524 is on, RC network 124 is coupled to output 210 of amplifier 122 via transistor 524. The RC network 124 is also coupled to transistor 420 via transistor 524. The RC network 124 therefore compensates amplifier 122 in this first example. At this time, because the voltage at HSG1 is lower than the voltage at HSG2, transistor 520 is off, and amplifier 120 is disconnected from RC network 124.

In a second example, if the voltage at HSG1 is higher than the voltage at HSG2, then the secondary amplifier 120 is working. Amplifier 122 saturates if amplifier 120 is on. A higher voltage at HSG1 than HSG2 turns on transistor 520, coupled to output 314 of amplifier 120. Turning on transistor 520 also turns on transistor 522. If transistors 520 and 522 are on, RC network 124 is coupled to output 314 of amplifier 120. Also, output 314 is coupled to $HS_{GATE}$ of high side transistor 102 via transistor 420. Therefore, in this second example, amplifier 120 is working as a secondary amplifier and controls the pyro fuse 130.

In these examples, the active amplifier (120 or 122) is coupled to RC network 124. The RC network 124 is shared between the two amplifiers 120 and 122 without duplication. Therefore, area savings may be achieved with the examples herein.

As described above, the primary amplifier (such as amplifier 122) may have a current limit set at 1 A in one example. The secondary amplifier (such as amplifier 120) may have a current limit set at 1.2 A. If the primary amplifier 122 is on, the voltage at $HS_{GATE}$ is pulled down. At this time, the secondary amplifier 120 pulls the voltage at HSG2 high. Therefore, the primary amplifier 122 and low side transistor 104 control the current $I_L$ 134 (not shown in FIG. 5) through the pyro fuse 130. If the primary amplifier 122 or low side transistor 104 cannot control the current $I_L$ 134, such as when a short circuit occurs, secondary amplifier 120 and high side transistor 102 control the current $I_L$ 134 via HSG2. If the short circuit occurs and low output node 112 is pulled to ground, primary amplifier 122 saturates by pushing up the voltage at HSG1. The secondary amplifier 120 turns on, causing the voltage at HSG2 to drop and turn on transistors 520 and 522 as described above. Therefore, the lower of the two voltages at HSG1 or HSG2 will control $HS_{GATE}$. The difference in these two voltages (HSG1 and HSG2) causes transistors 520, 522, and 524 to turn on or off and operate as switches that couple RC network 124 to the appropriate amplifier (120 or 122) and to $HS_{GATE}$.

Accordingly, if primary amplifier 122 is working, the voltage at HSG1 is pulled down, which turns on transistor 524 and turns off transistors 520 and 522. RC network 124 is coupled to primary amplifier 122, and primary amplifier 122 controls $HS_{GATE}$ of high side transistor 102. If the first input 206 of primary amplifier 122 is shorted to ground (e.g., low output node 112 is shorted), primary amplifier 122 increases current at output 210, which raises the voltage at HSG1. An increase in voltage at HSG1 turns off transistor 524 and turns on transistors 520 and 522. If transistors 520 and 522 are on, RC network 124 is coupled to output 314 of secondary amplifier 120, and secondary amplifier 120 controls $HS_{GATE}$ of high side transistor 102. Therefore, the secondary amplifier 120 provides redundancy in the event of a short circuit that renders primary amplifier 122 unable to control high side transistor 102.

In examples herein, a circuit architecture for a pyro driver is described that uses one RC network 124 for compensating both a primary amplifier 122 and a secondary amplifier 120. At any given time, only one of the amplifiers is active. A set of switches couple the active amplifier to the RC network 124. Therefore, the RC network 124 is shared between the two amplifiers, and large area savings may be realized. In one example, area savings of 20% or more may be realized. The circuit architecture described herein also provides redundancy for a safety application such as a pyro driver.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

While the use of particular transistors are described herein, other transistors (or equivalent devices) may be used instead with little or no change to the remaining circuitry. For example, a metal-oxide-silicon field-effect transistor ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). In general, herein, a transistor has a control input/control terminal (e.g., a gate, base) and two additional terminals (e.g., source/drain, collector/emitter).

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the term "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

As used herein, the terms "terminal," "node," "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Modifications are possible in the described examples, and other examples are possible within the scope of the claims.

What is claimed is:

1. A circuit, comprising:
   a transistor;
   a first amplifier having an output coupled to a control terminal of the transistor;
   a second amplifier having a second amplifier output coupled to the control terminal of the transistor;
   a resistor-capacitor network;
   a first switch coupled to the first amplifier output, the transistor, and the resistor-capacitor network; and
   a second switch coupled to the second amplifier output, the transistor, and the resistor-capacitor network, wherein the first switch is configured to couple the first amplifier output to the resistor-capacitor network, and the second switch is configured to couple the second amplifier output to the resistor-capacitor network.

2. The circuit of claim 1, wherein the transistor is a high-side transistor having a source terminal configured to be coupled to a pyro fuse.

3. The circuit of claim 1, wherein the transistor is a first transistor, and the circuit includes a second transistor, wherein the second transistor includes a drain terminal configured to be coupled to a pyro fuse and to an input of the first amplifier.

4. The circuit of claim 1, wherein the first amplifier includes a first amplifier input coupled to a sense transistor, and includes a second amplifier input configured to be coupled to a pyro fuse.

5. The circuit of claim 4, wherein the sense transistor includes a control terminal coupled to a control terminal of a second transistor.

6. The circuit of claim 1, wherein the second amplifier includes a first amplifier input coupled to a voltage source, and includes a second amplifier input coupled to a second transistor.

7. The circuit of claim 1, wherein the transistor is a first transistor, the first switch is a second transistor, and the second switch is a third transistor.

8. The circuit of claim 1, wherein the resistor-capacitor network provides a two-pole system.

9. A circuit, comprising:
a transistor;
a pyro fuse;
a first current source and a second current source;
a resistor;
a resistor-capacitor network;
a first amplifier having a first amplifier output coupled to a control terminal of the transistor, a first amplifier input coupled to the pyro fuse, and a second amplifier input coupled to the first current source;
a second amplifier having a second amplifier output coupled to the control terminal of the transistor, a third amplifier input coupled to the second current source, and a fourth amplifier input coupled to the resistor;
a first switch coupled to the first amplifier output, the transistor, and the resistor-capacitor network; and
a second switch coupled to the second amplifier output, the transistor, and the resistor-capacitor network, wherein the first switch is configured to couple the first amplifier output to the resistor-capacitor network, and the second switch is configured to couple the second amplifier output to the resistor-capacitor network.

10. The circuit of claim 9, wherein the fourth amplifier input is also coupled to a sense transistor.

11. The circuit of claim 10, wherein the sense transistor is coupled to the control terminal of the transistor.

12. The circuit of claim 9, wherein the second amplifier input is also coupled to a sense transistor.

13. The circuit of claim 12, wherein the transistor is a first transistor, and the sense transistor is coupled to a second transistor.

14. The circuit of claim 13, wherein the first transistor is a high-side transistor, and the second transistor is a low-side transistor.

15. The circuit of claim 9, wherein the first switch is configured to couple the first amplifier to the resistor-capacitor network if the first amplifier is on.

16. The circuit of claim 9, wherein the second switch is configured to couple the second amplifier to the resistor-capacitor network if the first amplifier input or the second amplifier input is shorted to a ground voltage.

17. A circuit, comprising:
a first switch and a second switch;
a transistor;
a pyro fuse;
a first amplifier having a first amplifier output coupled to the first switch and to a control terminal of the transistor configured to control the pyro fuse;
a second amplifier having a second amplifier output coupled to the second switch and to the control terminal of the transistor configured to control the pyro fuse; and
a resistor-capacitor network configured to compensate the first amplifier and the second amplifier, wherein the resistor-capacitor network is coupled to the first amplifier via the first switch and coupled to the second amplifier via the second switch.

18. The circuit of claim 17, wherein the transistor is a first transistor, and the first switch includes a second transistor having a source coupled to the first amplifier output and a control terminal coupled to the second amplifier output.

19. The circuit of claim 18, wherein the second switch includes a third transistor having a source coupled to the second amplifier output and a control terminal coupled to the first amplifier output.

20. The circuit of claim 17, wherein the first amplifier has a first current limit, and the second amplifier has a second current limit, and the first current limit is lower than the second current limit.

* * * * *